(12) United States Patent
Son et al.

(10) Patent No.: US 11,823,764 B2
(45) Date of Patent: Nov. 21, 2023

(54) PROCESSING-IN-MEMORY DEVICES FOR ELEMENT-WISE MULTIPLICATION

(71) Applicant: SK hynix Inc., Icheon-si (KR)

(72) Inventors: Mun Gyu Son, Icheon-si (KR); Chun Seok Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/864,871

(22) Filed: Jul. 14, 2022

(65) Prior Publication Data

US 2022/0358975 A1     Nov. 10, 2022

Related U.S. Application Data

(62) Division of application No. 17/319,660, filed on May 13, 2021, now Pat. No. 11,423,959.

(30) Foreign Application Priority Data

Jan. 11, 2021    (KR) ........................ 10-2021-0003633

(51) Int. Cl.
     *G11C 7/10*      (2006.01)
     *G06F 7/544*      (2006.01)

(52) U.S. Cl.
     CPC .......... *G11C 7/1039* (2013.01); *G06F 7/5443* (2013.01); *G11C 7/1063* (2013.01); *G11C 7/1069* (2013.01)

(58) Field of Classification Search
     CPC ... G11C 7/1039; G11C 7/1063; G11C 7/1069; G06F 7/5443
     See application file for complete search history.

(56) References Cited

U.S. PATENT DOCUMENTS 10,621,489 B2     4/2020   Appuswamy et al.

FOREIGN PATENT DOCUMENTS

KR     1020200019736 A     2/2020

*Primary Examiner* — Ajay Ojha
(74) *Attorney, Agent, or Firm* — WILLIAM PARK & ASSOCIATES LTD.

(57) ABSTRACT

A processing-in-memory (PIM) device includes a multiplication-and-accumulation (MAC) circuit, a memory circuit, and an address pipeline circuit. The MAC circuit is configured to perform a MAC arithmetic operation or an element-wise multiplication (EWM) calculation for first input data and second input data to generate result data. The memory circuit is configured to output the first input data and the second input data to the MAC circuit in response to a read control signal and is configured to store the result data in response to a write control signal. The address pipeline circuit is configured to receive the read control signal to store an address signal used as a target address signal for designating a region of the memory circuit into which the result data are stored. In addition, the address pipeline circuit is configured to receive the write control signal to output the target address signal to the memory circuit.

14 Claims, 15 Drawing Sheets

PROCESSING-IN-MEMORY DEVICES FOR ELEMENT-WISE MULTIPLICATION

CROSS-REFERENCE TO RELATED APPLICATION

This application is a divisional of U.S. patent application Ser. No. 17/319,660, filed on May 13, 2021, which claims priority under 35 U.S.C. § 119(a) to Korean Patent Application No. 10-2021-0003633 filed on Jan. 11, 2021. The disclosure of each of the foregoing application is incorporated herein by reference in its entirety.

BACKGROUND

1. Technical Field

Various embodiments of the present teachings relate to processing-in-memory (hereinafter, referred to as 'PIM') devices, and more particularly, to PIM devices for an element-wise multiplication (hereinafter, referred to as 'EWM').

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor.

SUMMARY

According to an embodiment, a processing-in-memory (PIM) device includes a multiplication-and-accumulation (MAC) circuit, a memory circuit, and an address pipeline circuit. The MAC circuit is configured to perform a MAC arithmetic operation or an element-wise multiplication (EWM) calculation for first input data and second input data to generate result data. The memory circuit is configured to output the first input data and the second input data to the MAC circuit in response to a read control signal and is configured to store the result data in response to a write control signal. The address pipeline circuit is configured to receive the read control signal to store an address signal used as a target address signal for designating a region of the memory circuit into which the result data are stored and is configured to receive the write control signal to output the target address signal to the memory circuit.

BRIEF DESCRIPTION OF THE DRAWINGS

Certain features of the disclosed technology are illustrated by various embodiments with reference to the attached drawings, in which.

DETAILED DESCRIPTION

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices that perform an element-wise multiplication (EWM) arithmetic operation based on commands transmitted at an interval of a CAS to CAS command delay time "tCCD" to accelerate the EWM arithmetic operation.

Figure 1:
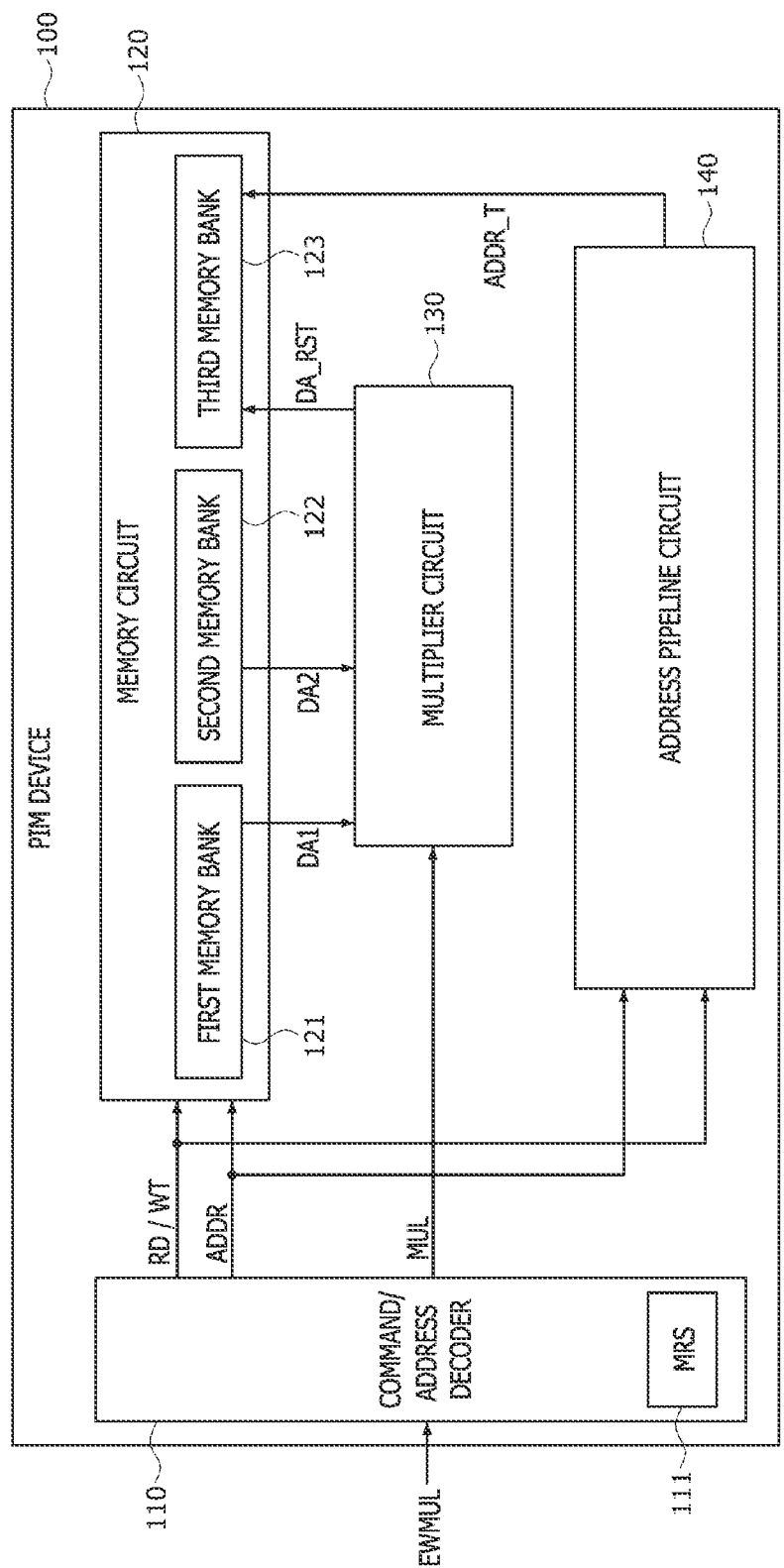
FIG. 1 is a block diagram illustrating a PIM device according to an embodiment of the present teachings.

FIG. 1 is a block diagram illustrating a PIM device 100 according to an embodiment of the present teachings. Referring to FIG. 1, the PIM device 100 may include a command/address decoder 110, a memory circuit 120, a multiplier circuit 130, and an address pipeline circuit 140.

The command/address decoder 110 may receive a command from an external device, for example, a host or a controller. The command/address decoder 110 may also receive information on an address in addition to the command. Hereinafter, it may be assumed that the command includes the information on the address. The command/address decoder 110 may decode the command to generate various control signals RD, WT, and MUL. The command/address decoder 110 may also decode the address information to generate an address signal ADDR. In another embodiment, the command/address decoder 110 may include a command decoder decoding the command and an address decoder decoding the address information.

In an embodiment, the command/address decoder 110 may receive an EWM command EWMUL from an external device. The command/address decoder 110 may decode the EWM command EWMUL to generate a read control signal RD, a write control signal WT, an arithmetic control signal MUL, and the address signal ADDR. The read control signal RD, the write control signal WT, and the address signal ADDR generated by the command/address decoder 110 may transmitted to both of the memory circuit 120 and the address pipeline circuit 140. The arithmetic control signal MUL generated by the command/address decoder 110 may be transmitted to the multiplier circuit 130.

The command/address decoder 110 may include a mode register set (MRS) 111. The mode register set 111 may have predetermined values relating to information on parameters necessary for operation of the PIM device 100. The PIM device 100 may perform general memory access operations, for example, a memory read operation and a memory write operation. In addition, the PIM device 100 may perform an EWM arithmetic operation. In the present embodiment, the EWM arithmetic operation means an operation that executes an element-wise multiplication of two matrices having the same form. Hereinafter, the term "EWM arithmetic operation" may be construed as having the same meaning as the term "EWM calculation." The mode register set 111 may have a first predetermined value used for the memory access operation of the PIM device 100 and a second predetermined value used for the EWM arithmetic operation of the PIM device 100. For example, the mode register set 111 may activate the first predetermined value to perform the memory access operation such as the memory read operation or the memory write operation of the PIM device 100. In contrast, the mode register set 111 may activate the second predetermined value to perform the EWM arithmetic operation of the PIM device 100.

Hereinafter, it may be assumed that the PIM device 100 operates to perform the EWM arithmetic operation and the mode register set 111 activates the second predetermined value to perform EWM arithmetic operation. Thus, the read control signal RD and the write control signal WT outputted from the command/address decoder 110 during the EWM arithmetic operation of the PIM device 100 may be distinguished from the read control signal and the write control signal outputted from the command/address decoder 110 during the memory access operation of the PIM device 100.

The memory circuit 120 may include a first memory bank 121, a second memory bank 122, and a third memory bank 123. In an embodiment, the memory circuit 120 may include volatile memory such as SRAM or DRAM. For example, the memory circuit 120 may include SRAM, synchronous DRAM (SDRAM), double data rate synchronous DRAM (DDR SDRAM, DDR2 SDRAM, or DDR3 SDRAM), graphic double data rate synchronous DRAM (GDDR, GDDR2, GDDR3, or the like), quad data rate DRAM (QDR DRAM), Rambus extreme data rate DRAM (Rambus XDR DRAM), fast page mode DRAM (FPM DRAM), video DRAM (VDRAM), extended data output DRAM (EDO DRAM), burst extended data output DRAM (BEDO DRAM), multibank DRAM (MDRAM), synchronous graphic RAM (SGRAM), or another type DRAM. In yet another embodiment, the memory circuit 120 may include nonvolatile memory such as flash memory, phase change memory (PCRAM), resistive memory (ReRAM), ferroelectric memory (FeRAM), or magnetic memory (MRAM). In still another embodiment, the memory circuit 120 may include both volatile memory and nonvolatile memory.

The first memory bank 121, the second memory bank 122, and the third memory bank 123 may have a plurality of rows and a plurality of columns. Memory cells may be located at cross points of the rows and the columns, respectively. Access to the memory cells in the first to third memory banks 121, 122, and 123 may be achieved by a row address and a column address. That is, when the row address and the column address is determined, a memory cell located in a column designated by the column address among memory cells arrayed in a row designated by the row address may be selected.

The first memory bank 121 may store first input data DA1 which are used for the EWM arithmetic operation, and the second memory bank 122 may store second input data DA2 which are used for the EWM arithmetic operation. An operation for storing the first input data DA1 into the first memory bank 121 and for storing the second input data DA2 into the second memory bank 122 may be performed by a general memory write operation. Hereinafter, it may be assumed that the first input data DA1 and the second input data DA2 are stored in respective ones of the first memory bank 121 and the second memory banks 122 by the general memory write operation. Result data DA_RST generated by the EWM arithmetic operation may be stored into the third memory bank 123.

The first memory bank 121 and the second memory bank 122 may output and transmit the first input data DA1 and the second input data DA2 to the multiplier circuit 130 in response to the read control signal RD outputted from the command/address decoder 110. The third memory bank 123 may store the result data DA_RST outputted from the multiplier circuit 130 in response to the write control signal WT outputted from the command/address decoder 110. In order to store the result data DA_RST into the third memory bank 123, the third memory bank 123 may receive a target address signal ADDR_T from the address pipeline circuit

140. The third memory bank 123 may store the result data DA_RST into a location corresponding to the target address signal ADDR_T in response to the write control signal WT outputted from the command/address decoder 110.

The multiplier circuit 130 may perform the EWM arithmetic operation of the first input data DA1 and the second input data DA2, which are received from the first memory bank 121 and the second memory bank 122, respectively, to generate the result data DA_RST. The multiplier circuit 130 may perform the EWM arithmetic operation in response to the arithmetic control signal MUL outputted from the command/address decoder 110. The multiplier circuit 130 may transmit the result data DA_RST to the third memory bank 123 of the memory circuit 120. In an embodiment, the multiplier circuit 130 may include at least one multiplier that performs a multiplying calculation of the first input data DA1 and the second input data DA2 to output result data of the multiplying calculation.

The address pipeline circuit 140 may store the target address signal ADDR_T which is transmitted to the third memory bank 123. The target address signal ADDR_T may be defined as an address signal for designating a location of the third memory bank 123 into which the result data DA_RST outputted from the multiplier circuit 130 are stored. The address pipeline circuit 140 may transmit the target address signal ADDR_T to the third memory bank 123 in response to the write control signal WT. The address pipeline circuit 140 may include a plurality of storage regions, each of which is capable of storing the target address signal ADDR_T. In an embodiment, each of the plurality of storage regions may include an address register.

Specifically, the address pipeline circuit 140 may perform an address storage operation and an address output operation. The address storage operation of the address pipeline circuit 140 may be performed in response to the read control signal RD outputted from the command/address decoder 110. That is, the address pipeline circuit 140 may store the address signal ADDR transmitted with the read control signal RD as the target address signal ADDR_T, in response to the read control signal RD. In such a case, the address pipeline circuit 140 may generate an index corresponding to the read control signal RD. The target address signal ADDR_T and the read control signal RD may be related to each other by the index.

The address output operation of the address pipeline circuit 140 may be performed in response to the write control signal WT outputted from the command/address decoder 110. That is, the address pipeline circuit 140 may output and transmit the target address signal ADDR_T stored therein to the third memory bank 123 of the memory circuit 120 in response to the write control signal WT. In such case, the address pipeline circuit 140 may generate an index selection signal corresponding to the write control signal WT. The address pipeline circuit 140 may transmit the target address signal ADDR_T, which corresponds to the index having the same value as the index selection signal, to the third memory bank 123. For example, when the index selection signal has a logic level combination of '111', the address pipeline circuit 140 may transmit the target address signal ADDR_T, which corresponds to the index having a logic level combination of '111', to the third memory bank 123.

When the EWM command EWMUL is transmitted to the PIM device 100, the first input data DA1 and the second input data DA2 may be transmitted from the first memory bank 121 and the second memory bank 122 to the multiplier circuit 130. In addition, the address signal ADDR for designating a location of the third memory bank 123 storing the result data DA_RST outputted from the multiplier circuit 130 may be stored into the address pipeline circuit 140 as the target address signal ADDR_T. The target address signal ADDR_T stored in the address pipeline circuit 140 may be transmitted to the third memory bank 123. Also the write control signal WT for storing the result data DA_RST into the third memory bank 123 may be transmitted to the third memory bank 123 with the target address signal ADDR_T. As described above, because the target address signal ADDR_T is generated by the address pipeline circuit 140 and is transmitted to the third memory bank 123, it may be unnecessary to maintain the address signal ADDR generated by the command/address decoder 110 until the result data DA_RST are stored into the third memory bank 123. Thus, the command/address decoder 110 may execute the EWM command EWMUL at an interval of a CAS to CAS command delay time "tCCD" corresponding to a minimum interval time between commands which are sequentially generated.

Figure 2:
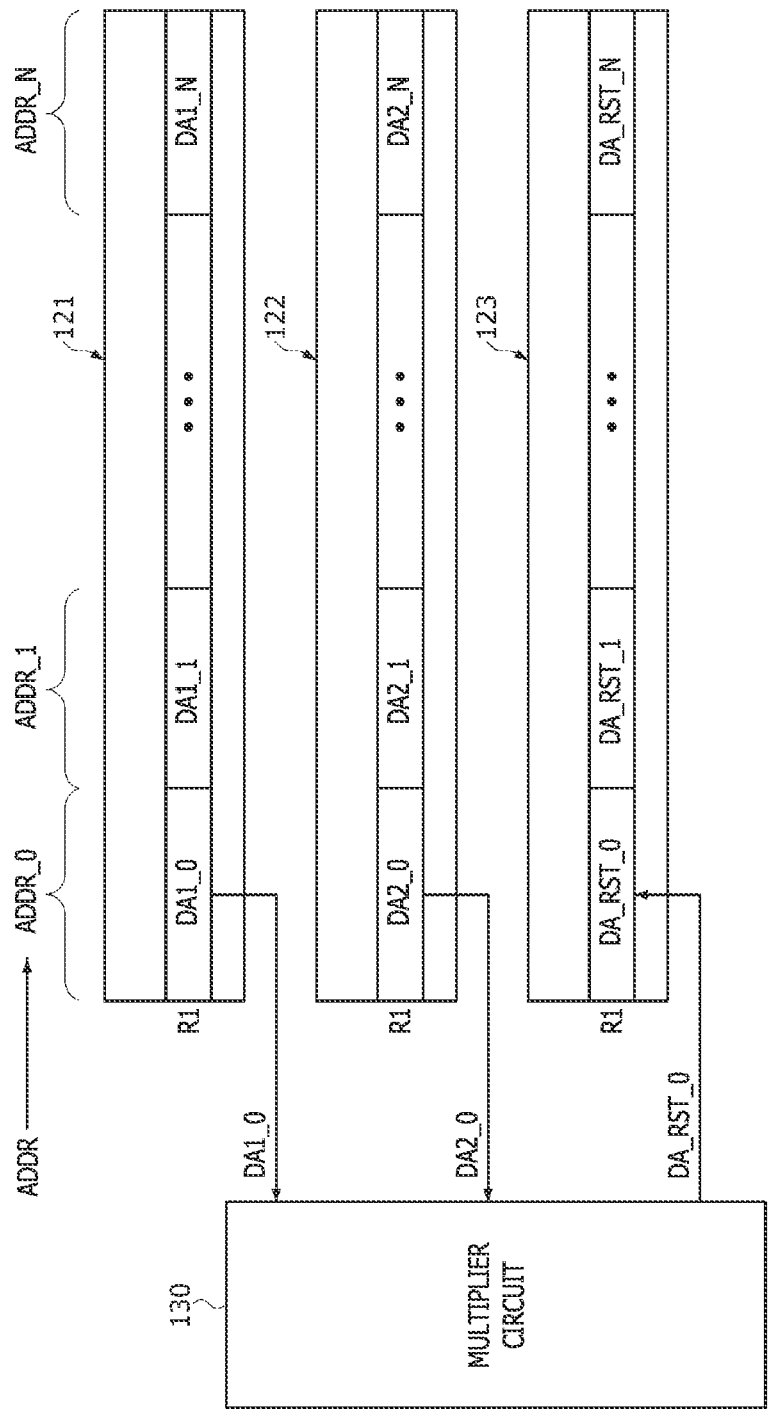
FIG. 2 is a schematic view illustrating an EWM process performed by the PIM device illustrated in FIG. 1.

FIG. 2 is a schematic view illustrating the EWM arithmetic operation performed by the PIM device 100 illustrated in FIG. 1. Referring to FIG. 2, the PIM device 100 may perform the EWM arithmetic operation of the first input data DA1_0~DA1_N and the second input data DA2_0~DA2_N to generate the result data DA_RST_0~DA_RST_N (where "N" denotes a natural number). Hereinafter, it may be assumed that all of the first input data DA1_0~DA1_N, the second input data DA2_0~DA2_N, and the result data DA_RST_0~DA_RST_N have a floating-point type.

When the EWM arithmetic operation is performed for a first matrix and a second matrix, the first input data DA1_0~DA1_N may correspond to elements of the first matrix and the second input data DA2_0~DA2_N may correspond to elements of the second matrix. In such a case, the first input data inputted to the multiplier circuit 130 among the first input data DA1_0~DA1_N and the second input data inputted to the multiplier circuit 130 among the second input data DA2_0~DA2_N may correspond to two elements which are located at the same position in the first matrix and the second matrix. Alternatively, the first input data DA1_0~DA1_N may correspond to one of the elements arrayed in the first matrix, and the second input data DA2_0~DA2_N may correspond to one of the elements arrayed in the second matrix. Even in such a case, the first input data DA1_0~DA1_N and the second input data DA2_0~DA2_N may correspond to two elements which are located at the same position in the first matrix and the second matrix.

The first input data DA1_0~DA1_N may be stored in a first row R1 of the first memory bank 121, and the second input data DA2_0~DA2_N may be stored in a first row R1 of the second memory bank 122. Further, the result data DA_RST_0~DA_RST_N may be stored in a first row R1 of the third memory bank 123. All of the first rows R1 of the first to third memory banks 121, 122, and 123 may have the same row address.

In an embodiment, each of the first input data DA1_0~DA1_N and each of the second input data DA2_0~DA2_N may have a data size which is appropriate for computational ability of a multiplier included in the multiplier circuit 130. For example, when the multiplier included in the multiplier circuit 130 is able to perform a multiplying calculation for 16-bit data having a floating-point type, each of the first input data DA1_0 and the second input data DA2_0 inputted to the multiplier may include 16-bit data having a floating-point type. In such a case, in order to complete the EWM arithmetic operation of the first input data DA1_0~DA1_N and the second input data DA2_0~DA2_N, the multiplier circuit 130 has to iteratively perform the EWM calculation (N+1) times.

In order that the PIM device 100 performs the EWM calculation (N+1) times, the PIM device 100 has to receive the EWM command EWMUL from an external device such as a host or a controller (N+1) times. In the present embodiment, it may be assumed that the EWM command EWMUL includes the address signal ADDR. However, the present embodiment is merely an example of the present disclosure. Accordingly, in another embodiment, the EWM command EWMUL and the address signal ADDR may be separately and independently transmitted. In the present embodiment, it may be assumed that the address signal ADDR includes a column address signal. Thus, the address signal ADDR included in the EWM command EWMUL may mean a column address for designating regions storing the first input data DA1 and the second data DA2 and for designating a region into which the result data DA_RST are stored. Hereinafter, it may be assumed that the first input data and the second input data are stored in regions having the same column address and the result data may also be stored into a region having the same column address.

When the EWM command EWMUL including a first address signal ADDR_0 is transmitted to the PIM device 100, the PIM device 100 may perform a first EWM calculation. In such a case, in order to perform the first EWM calculation, the first input data DA1_0 stored in a region of the first memory bank 121 designated by the first address signal ADDR_0 may be transmitted to the multiplier circuit 130, and the second input data DA2_0 stored in a region of the second memory bank 122 designated by the first address signal ADDR_0 may also be transmitted to the multiplier circuit 130, as illustrated in FIG. 2. The multiplier circuit 130 may perform the EWM calculation of the first input data DA1_0 and the second input data DA2_0 to generate a first result data DA_RST_0. The first result data DA_RST_0 may be stored into a region of the third memory bank 123 designated by the first address signal ADDR_0.

When the EWM command EWMUL including a second address signal ADDR_1 is transmitted to the PIM device 100, the PIM device 100 may perform a second EWM calculation. In such a case, in order to perform the second EWM calculation, the first input data DA1_1 stored in a region of the first memory bank 121 designated by the second address signal ADDR_1 may be transmitted to the multiplier circuit 130, and the second input data DA2_1 stored in a region of the second memory bank 122 designated by the second address signal ADDR_1 may also be transmitted to the multiplier circuit 130. The multiplier circuit 130 may perform the EWM calculation of the first input data DA1_1 and the second input data DA2_1 to generate a second result data DA_RST_1. The second result data DA_RST_1 may be stored into a region of the third memory bank 123 designated by the second address signal ADDR_1. As a result, the EWM calculation may be iteratively performed (N+1) times to process all of the first input data DA1_0~DA1_N and the second input data DA2_0~DA2_N.

As described above, each of the first to (N+1)th EWM calculations may terminate after the result data DA_RST is stored into the third memory bank 123. In order to store the result data DA_RST into the third memory bank 123, the address signal ADDR for designating a region of the third memory bank 123 into which the result data DA_RST are stored has to maintain an activated state. For example, the first address signal ADDR_0 has to be activated until the first result data DA_RST_0 generate by the first EWM calculation are stored into the third memory bank 123. Thus, in a general case, it may be impossible to perform the second EWM calculation until the first result data DA_RST_0 are stored into the third memory bank 123. However, according to the present embodiment, the first address signal ADDR_0 may be stored into the address pipeline circuit (140 of FIG. 1) as the target address signal ADDR_T, and the target address signal ADDR_T (i.e., the first address signal ADDR_0) stored in the address pipeline circuit 140 may be transmitted to the third memory bank 123 at a point in time when the first result data DA_RST_0 are stored into the third memory bank 123. Accordingly, it may be possible to perform the second EWM calculation even before the first result data DA_RST_0 are stored into the third memory bank 123. Thus, the first EWM calculation and the second EWM calculation may be concurrently performed to partially overlap with each other.

Figure 3:
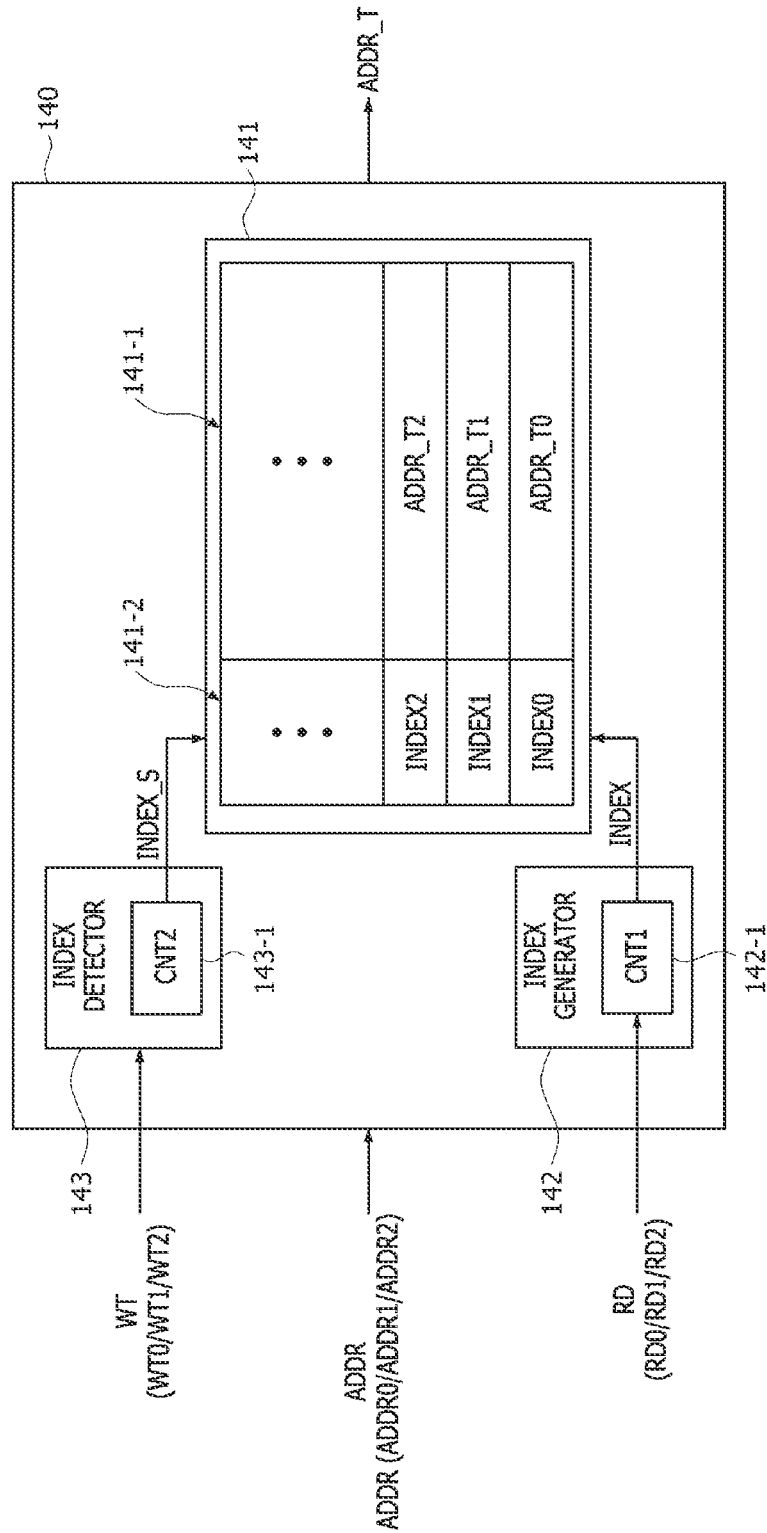
FIG. 3 illustrates a configuration of an address pipeline circuit included in the PIM device illustrated in FIG. 1.

FIG. 3 illustrates a configuration of the address pipeline circuit 140 included in the PIM device 100 illustrated in FIG. 1. Hereinafter, it may be assumed that a first EWM command, a second EWM command, and a third EWM command are sequentially transmitted to the PIM device 100. Thus, a first read control signal RD0, a first write control signal WT0, and the first address signal ADDR_0 are transmitted to the address pipeline circuit 140; a second read control signal RD1, a second write control signal WT1, and the second address signal ADDR_1 are then transmitted to the address pipeline circuit 140; and a third read control signal RD2, a third write control signal WT2, and the third address signal ADDR_2 are finally transmitted to the address pipeline circuit 140. Referring to FIG. 3, the address pipeline circuit 140 may include an address storage part 141 storing the target address signal and the index, an index generator 142 generating the index, and an index detector 143 generating an index selection signal INDEX_S for detecting the index to designate the target address signal ADDR_T.

The address storage part 141 may have a plurality of address storage regions 141-1 and a plurality of index storage regions 141-2. A plurality of target address signals ADDR_T may be stored in the plurality of address storage regions 141-1, respectively. That is, the address signal ADDR transmitted from the command/address decoder (110 of FIG. 1) to the address pipeline circuit 140 may be stored into one of the plurality of address storage regions 141-1. For example, the first address signal ADDR_0 may be stored into a first address storage region 141-1 to act as a first target address signal ADDR_T0, the second address signal ADDR_1 may be stored into a second address storage region 141-1 to act as a second target address signal ADDR_T1, and the third address signal ADDR_2 may be stored into a third address storage region 141-1 to act as a third target address signal ADDR_T2. One index may be stored into one of the plurality of index storage regions 141-2. For example, a first index INDEX0 may be stored into a first index storage region 141-2, a second index INDEX1 may be stored into a second index storage region 141-2, and a third index INDEX2 may be stored into a third index storage region 141-2.

The target address signals ADDR_T stored in respective ones of the address storage regions 141-1 may correspond to the indexes stored in respective ones of the index storage regions 141-2 in a one-to-one manner. For example, the first target address signal ADDR_T0 may correspond to the first index INDEX0, the second target address signal ADDR_T1 may correspond to the second index INDEX1, and the third target address signal ADDR_T2 may correspond to the third index INDEX2. Thus, when any one of the indexes is selected, the target address signal corresponding to the selected index among the plurality of target address signals may be selected.

The index generator 142 may generate the index in response to the read control signal RD outputted from the command/address decoder (110 of FIG. 1) and may transmit the generated index into one of the plurality of index storage regions 141-2. In an embodiment, the index generator 142 may include a first counter 142-1. The first counter 142-1 may receive the read control signal RD. The first counter 142-1 may count the read control signal RD to generate a counted value acting as the index and may output the index to the index storage region 141-2. In such a case, the index may be stored into the index storage region 141-2 to correspond to the target address signal ADDR_T matched with the address signal ADDR which is inputted with the read control signal RD.

Specifically, when the first read control signal RD0 and the first address signal ADDR0 are inputted to the address pipeline circuit 140, the first address signal ADDR0 may be stored into the address storage region 141-1 to act as the first target address signal ADDR_T0. The first counter 142-1 may count the first read control signal RD0 to generate the index having a counted value of '001'. The counted value of '001' may be stored into the index storage region 141-2 to act as the first index INDEX0 corresponding to the first target address signal ADDR_T0. Subsequently, when the second read control signal RD1 and the second address signal ADDR1 are inputted to the address pipeline circuit 140, the second address signal ADDR1 may be stored into the address storage region 141-1 to act as the second target address signal ADDR_T1. The first counter 142-1 may count the second read control signal RD1 to generate the index having a counted value of '010'. The counted value of '010' may be stored into the index storage region 141-2 to act as the second index INDEX1 corresponding to the second target address signal ADDR_T1. Similarly, when the third read control signal RD2 and the third address signal ADDR2 are inputted to the address pipeline circuit 140, the third address signal ADDR2 may be stored into the address storage region 141-1 to act as the third target address signal ADDR_T2. The first counter 142-1 may count the third read control signal RD2 to generate the index having a counted value of '011'. The counted value of '011' may be stored into the index storage region 141-2 to act as the third index INDEX2 corresponding to the third target address signal ADDR_T2.

The index detector 143 may generate the index selection signal INDEX_S in response to the write control signal WT outputted from the command/address decoder (110 of FIG. 1) and may transmit the index selection signal INDEX_S to the address storage part 141. In an embodiment, the index detector 143 may include a second counter 143-1. The second counter 143-1 may receive the write control signal WT. The second counter 143-1 may count the write control signal WT to generate a counted value acting as the index selection signal INDEX_S and may output the index selection signal INDEX_S to the address storage part 141.

Specifically, when the first write control signal WT0 is inputted to the index detector 143, the second counter 143-1 of the index detector 143 may count the first write control signal WT0 to generate and output a first counted value of '001' as the index selection signal INDEX_S. The address pipeline circuit 140 may output the first target address signal ADDR_T0 corresponding to the first index INDEX0 having the same value as the index selection signal INDEX_S. Subsequently, when the second write control signal WT1 is inputted to the index detector 143, the second counter 143-1 of the index detector 143 may count the second write control signal WT1 to generate and output a second counted value of '010' as the index selection signal INDEX_S. The address pipeline circuit 140 may output the second target address signal ADDR_T1 corresponding to the second index INDEX1 having the same value as the index selection signal INDEX_S. Thereafter, when the third write control signal WT2 is inputted to the index detector 143, the second counter 143-1 of the index detector 143 may count the third write control signal WT2 to generate and output a third counted value of '011' as the index selection signal INDEX_S. The address pipeline circuit 140 may output the third target address signal ADDR_T2 corresponding to the third index INDEX2 having the same value as the index selection signal INDEX_S.

According to the address pipeline circuit 140 described above, the first target address signal ADDR_T0 corresponding to the first address signal ADDR_0 and the first index INDEX0 may be stored into the address storage part 141 by the first read control signal RD0 which is generated by the first EWM command. Thus, if the first address signal ADDR0 is activated until the first input data DA1 and the second input data DA2 are transmitted from the first memory bank 121 and the second memory bank 122 to the multiplier circuit 130, the PIM device 100 may operate normally. That is, it may be unnecessary to maintain an activated state of the first address signal ADDR0 until the result data DA_RST are stored into the third memory bank 123. This timing of the first address signal ADDR0 may also be equally applicable to the second address signal ADDR1 and the third address signal ADDR2.

The target address signal ADDR_T outputted from the address pipeline circuit 140 may correspond to the index having the same value as the index selection signal INDEX_S. The index may have a counted value of the read control signal RD, and the index selection signal INDEX_S may have a counted value of the write control signal WT. Thus, that a value of the index is equal to a value of the index selection signal INDEX_S may mean that the read control signal RD and the write control signal WT are signals generated by the same EWM command. Accordingly, the result data DA_RST and the target address signal ADDR_T transmitted to the third memory bank 123 may correspond to the result data DA_RST and the address signal ADDR which are related to one EWM calculation.

Figure 4:
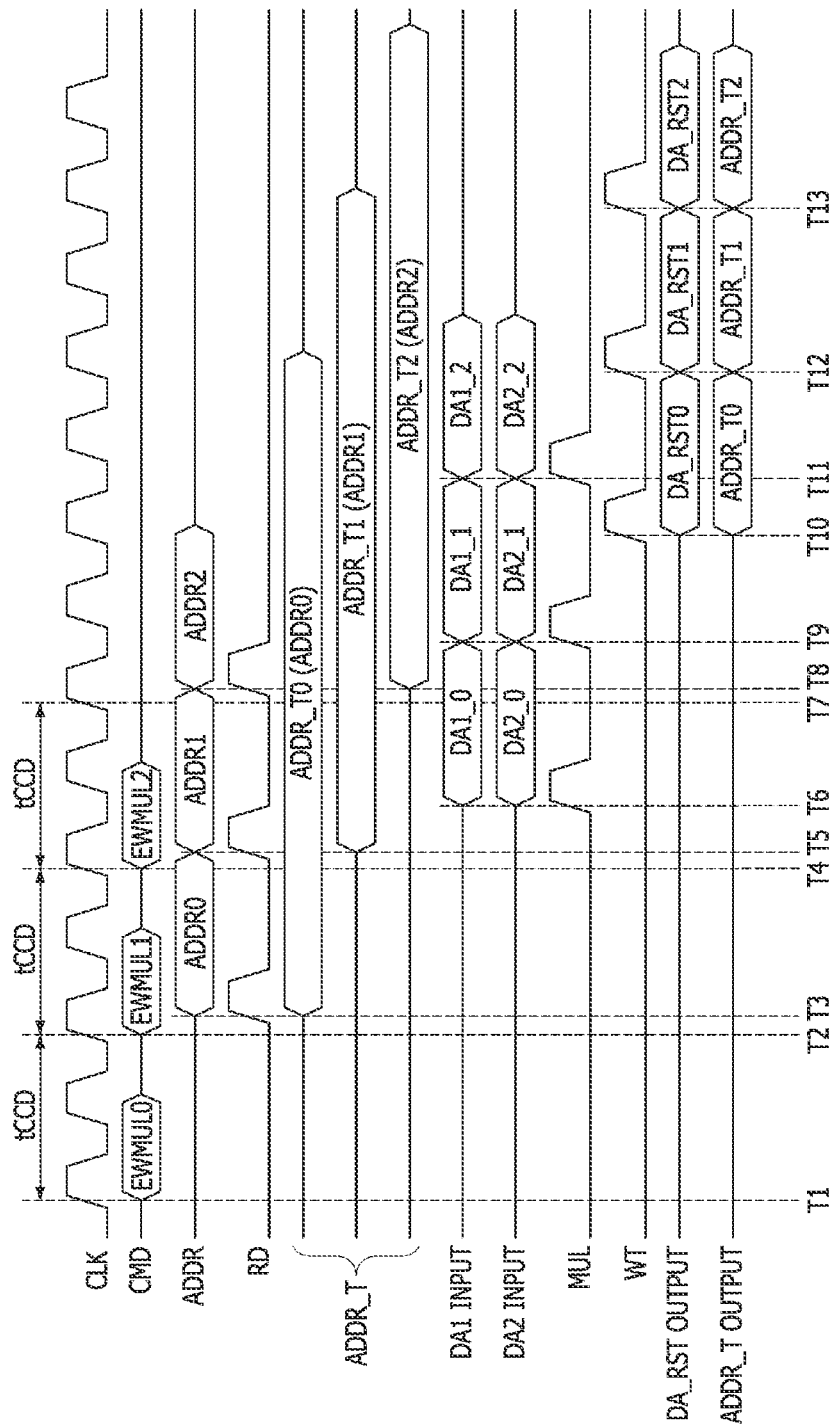
FIG. 4 is a timing diagram illustrating an EWM process performed by the PIM device illustrated in FIG. 1.

FIG. 4 is a timing diagram illustrating an EWM process performed by the PIM device 100 illustrated in FIG. 1, and FIGS. 5 to 13 are block diagrams illustrating EWM calculations executed at various points in time of the timing diagram illustrated in FIG. 4. Referring to FIG. 4, the PIM device 100 may sequentially receive the first to third EWM commands EWMUL0~EWMUL2 at an interval of the CAS to CAS command delay time "tCCD" (T1-T2, T2-T4, T4-T7). That is, at a first point in time "T1", the PIM device 100 may receive the first EWM command EWMUL0. The PIM device 100 may perform a first EWM calculation based on the first EWM command EWMUL0. At a second point in time "T2" when the CAS to CAS command delay time "tCCD" elapses from the first point in time "T1", the PIM device 100 may receive the second EWM command EWMUL1. The PIM device 100 may perform a second EWM calculation based on the second EWM command EWMUL1. At a fourth point in time "T4" when the CAS to CAS command delay time "tCCD" elapses from the second point in time "T2", the PIM device 100 may receive the third EWM command EWMUL2. The PIM device 100 may perform a third EWM calculation based on the third EWM command EWMUL2. According to the present embodiment, the first to third EWM calculations may be performed to partially overlap with each other in a timing diagram.

Figure 5:
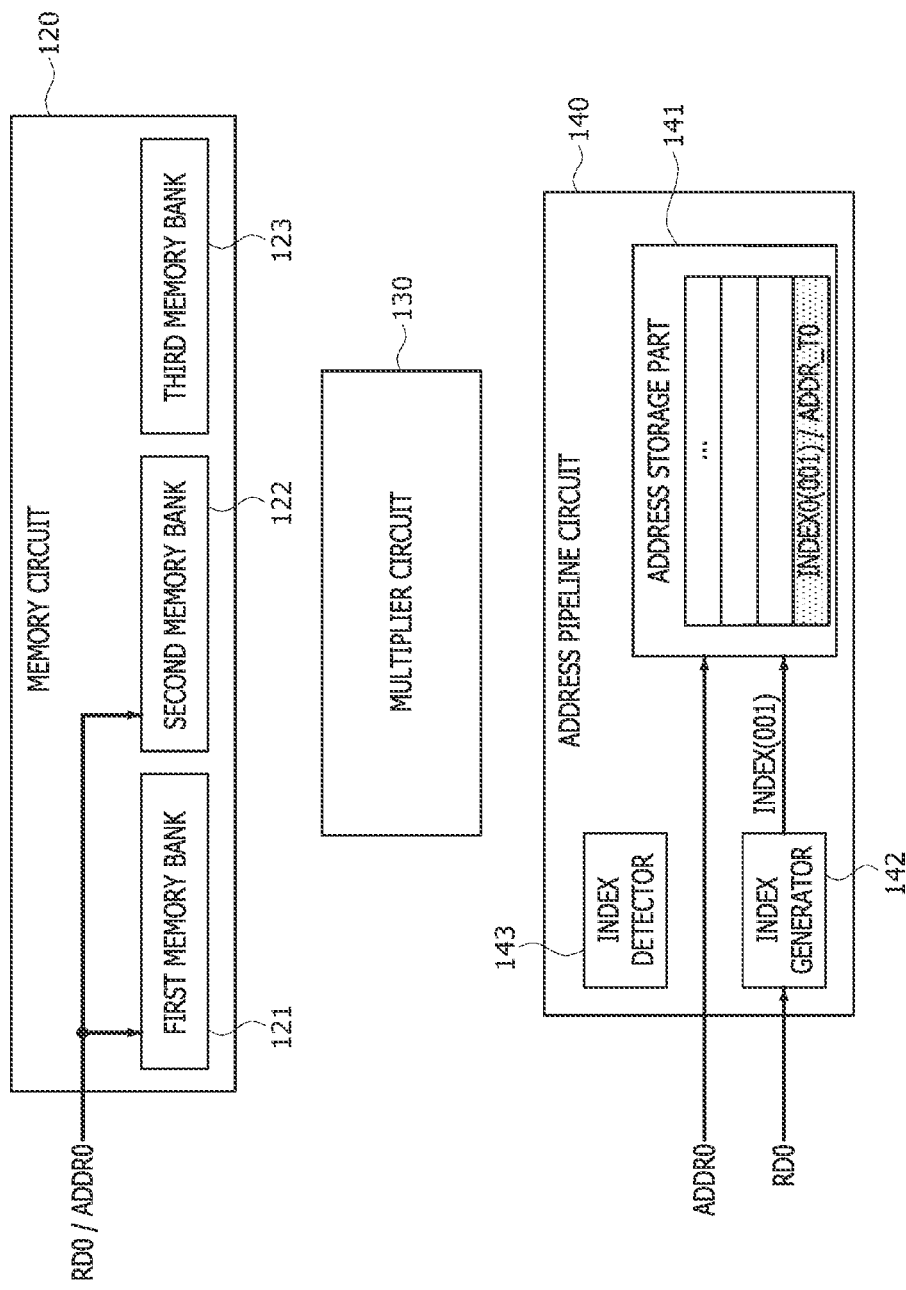
FIGS. 5 to 13 are block diagrams illustrating EWM calculations executed at various points in time of the timing diagram illustrated in FIG. 4.

Referring to FIGS. 4 and 5, when the first EWM command EWMUL0 is transmitted to the PIM device 100 at the first point in time "T1", the command/address decoder 110 of the PIM device 100 may decode the first EWM command EWMUL0 to generate and output the first read control signal RD0 and the first address signal ADDR0 at a third point in time "T3" when a certain time elapses from the first point in time "T1". An interval time between the first point in time "T1" and the third point in time "T3" may correspond to a time it takes the command/address decoder 110 to decode the first EWM command EWMUL0. The first read control signal RD0 and the first address signal ADDR0 generated by the command/address decoder 110 may be transmitted to the first and the second memory banks 121 and 122 of the memory circuit 120 as well as the address pipeline circuit 140. The first read control signal RD0 transmitted to the first and the second memory banks 121 and 122 of the memory circuit 120 may activate column lines in the first and second memory banks 121 and 122, which are designated by the first address signal ADDR0. The address pipeline circuit 140 may store the first address signal ADDR0 acting as the first target address signal ADDR_T0 into the address storage part 141. The index generator 142 of the address pipeline circuit 140 may count the first read control signal RD0 to generate the index of '001' and may transmit the index of '001' to the address storage part 141. The index of '001' outputted from the index generator 142 may be stored into the address storage part 141 to act as the first index INDEX0 corresponding to the first target address signal ADDR_T0.

Figure 6:
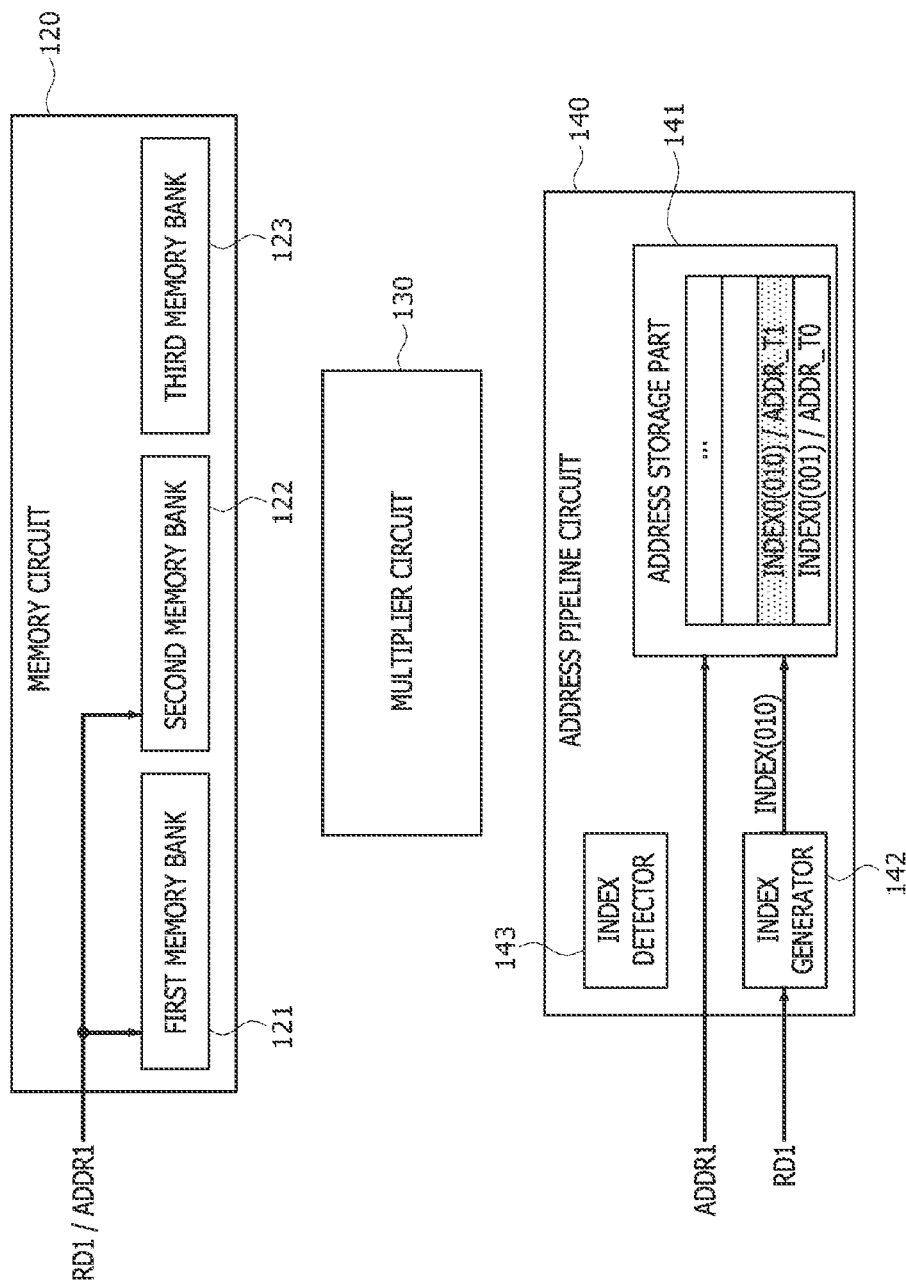

Referring to FIGS. 4 and 6, the second EWM command EWMUL1 may be transmitted to the PIM device 100 at the second point in time "T2" when the CAS to CAS command delay time "tCCD" elapses from the first point in time "T1" when the first EWM command EWMUL0 is transmitted to the PIM device 100. When the second EWM command EWMUL1 is transmitted to the PIM device 100 at the second point in time "T2", the command/address decoder 110 of the PIM device 100 may decode the second EWM command EWMUL1 to generate and output the second read control signal RD1 and the second address signal ADDR1 at a fifth point in time "T5" when a certain time elapses from the second point in time "T2". The fifth point in time "T5" may correspond to a point in time when a total time it takes the command/address decoder 110 to decode the first EWM command EWMUL0 and it takes the first read control signal RD0 and the first address signal ADDR0 to be transmitted elapses from the first point in time "T1". That is, the command/address decoder 110 may perform a decoding operation of the first EWM command EWMUL0 during a period from the first point in time "T1" until the third point in time "T3", and the first address signal ADDR0 outputted from the command/address decoder 110 at the third point in time "T3" may be transmitted to the first and second memory banks 121 and 122 until the fifth point in time "T5".

The second read control signal RD1 and the second address signal ADDR1 outputted from the command/address decoder 110 at the fifth point in time "T5" may be transmitted to the first and second memory banks 121 and 122 of the memory circuit 120 as well as the address pipeline circuit 140. The second read control signal RD1 transmitted to the first and the second memory banks 121 and 122 may activate column lines in the first and second memory banks 121 and 122, which are designated by the second address signal ADDR1. The address pipeline circuit 140 may store the second address signal ADDR1 acting as the second target address signal ADDR_T1 into the address storage part 141. The index generator 142 of the address pipeline circuit 140 may count the second read control signal RD1 to generate the index of '010' and may transmit the index of '010' to the address storage part 141. The index of '010' outputted from the index generator 142 may be stored into the address storage part 141 to act as the second index INDEX1 corresponding to the second target address signal ADDR_T1.

Figure 7:
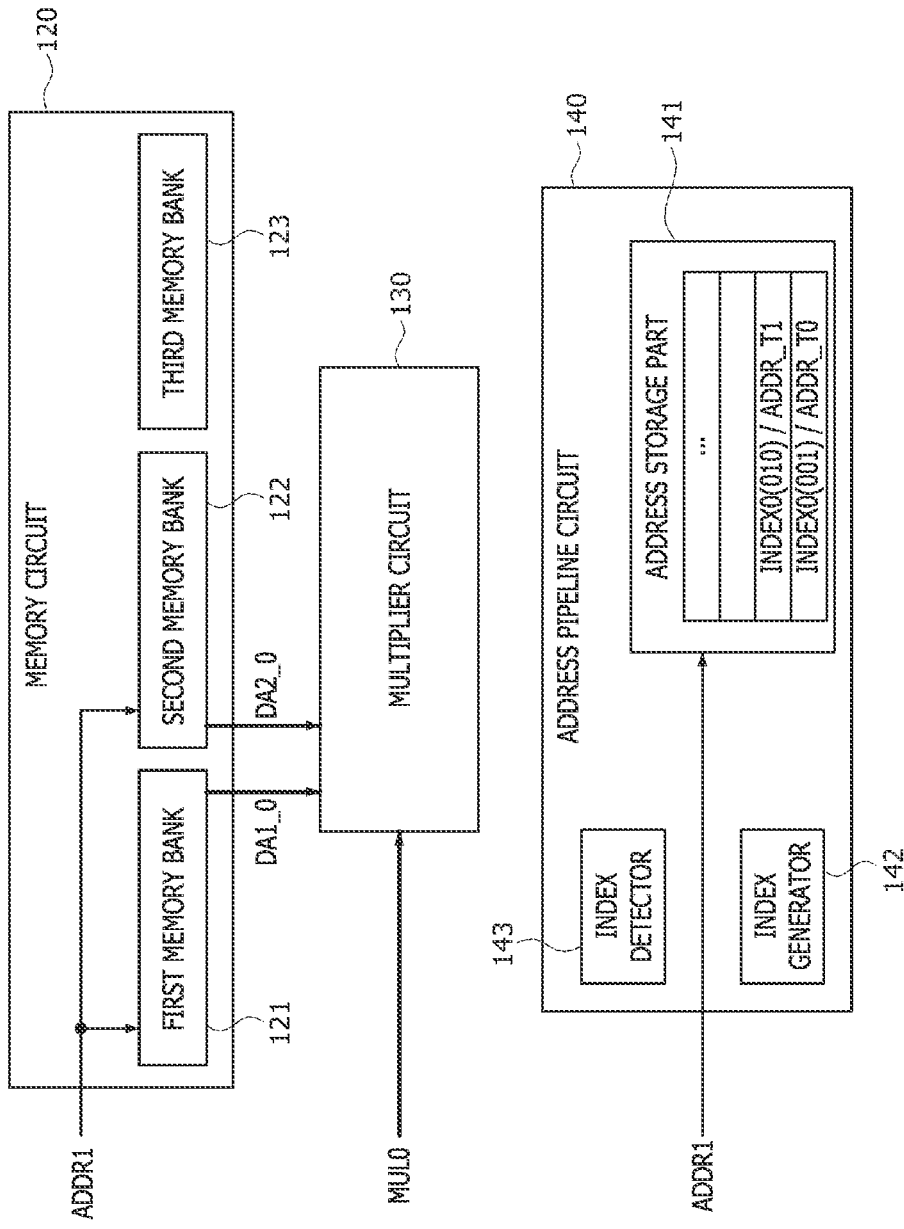

Referring to FIGS. 4 and 7, the command/address decoder 110 may generate and output a first arithmetic control signal MUL0 at a sixth point in time "T6" when a certain time elapses from the third point in time "T3" when the first read control signal RD0 is generated. The first arithmetic control signal MUL0 may be transmitted to the multiplier circuit 130. At the sixth point in time "T6" when the first arithmetic control signal MUL0 is outputted from the command/address decoder 110, the first input data DA1_0 and the second input data DA2_0 may start to be transmitted from the first and second memory banks 121 and 122 to the multiplier circuit 130. The first input data DA1_0 and the second input data DA2_0 may be transmitted from the first and second memory banks 121 and 122 to the multiplier circuit 130 until a next arithmetic control signal MUL is generated. The first input data DA1_0 and the second input data DA2_0 may be transmitted from the first and second memory banks 121 and 122 to the multiplier circuit 130 through column lines designated by the first address signal ADDR0. The multiplier circuit 130 may perform the first EWM calculation of the first input data DA1_0 and the second input data DA2_0 in response to the first arithmetic control signal MUL0 outputted from the command/address decoder 110.

Figure 8:
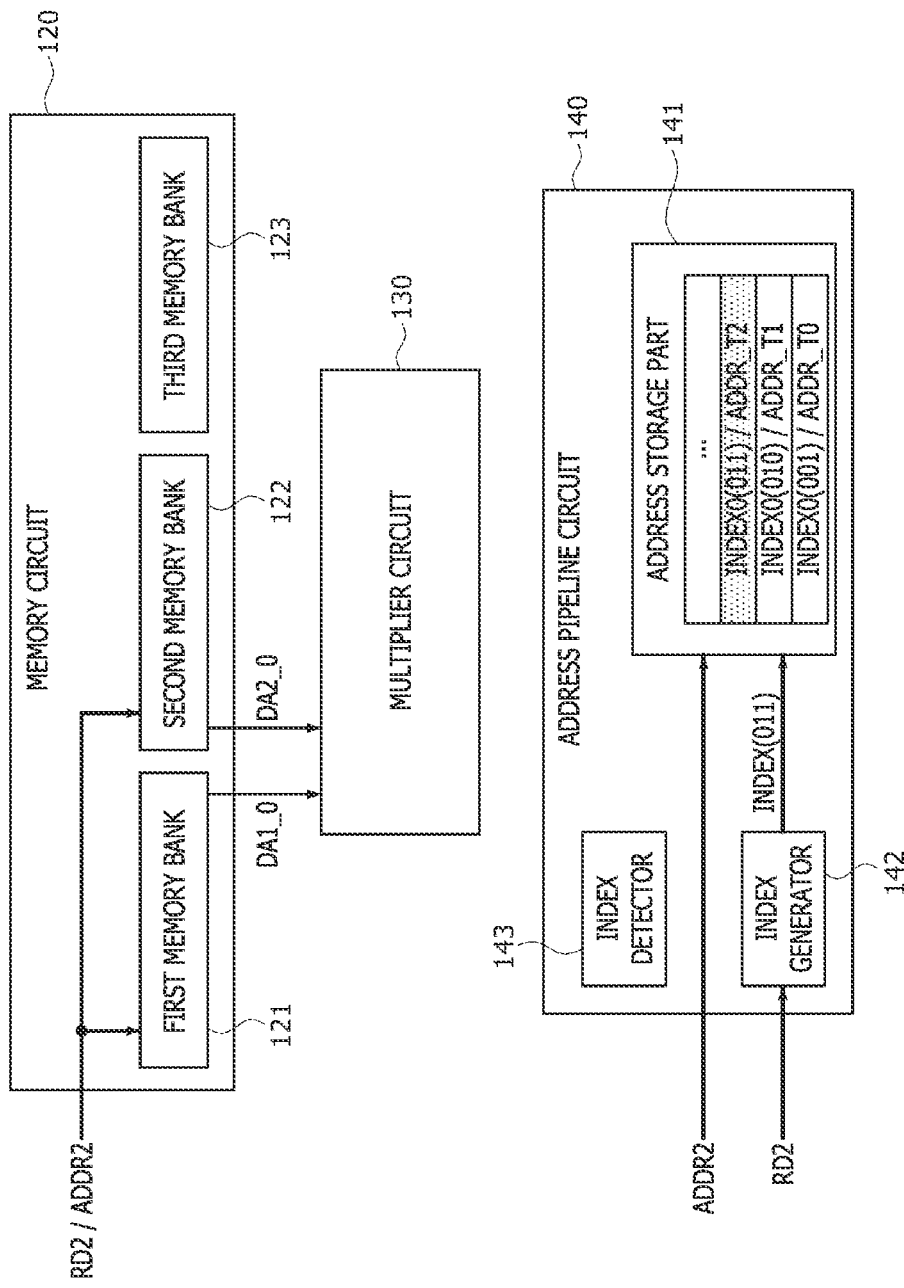

Referring to FIGS. 4 and 8, the third EWM command EWMUL2 may be transmitted to the PIM device 100 at the fourth point in time "T4" when the CAS to CAS command delay time "tCCD" elapses from the second point in time "T2" when the second EWM command EWMUL1 is transmitted to the PIM device 100. The command/address decoder 110 of the PIM device 100 may decode the third EWM command EWMUL2 to generate and output the third read control signal RD2 and the third address signal ADDR2 at an eighth point in time "T8" when a certain time elapses from the fourth point in time "T4". The eighth point in time "T8" may correspond to a point in time when a total time it takes the command/address decoder 110 to decode the second EWM command EWMUL1 and it takes the second read control signal RD1 and the second address signal ADDR1 to be transmitted elapses from the second point in time "T2". That is, the command/address decoder 110 may perform a decoding operation of the second EWM command EWMUL1 during a period from the second point in time "T2" until the fifth point in time "T5", and the second address signal ADDR1 outputted from the command/address decoder 110 at the fifth point in time "T5" may be transmitted to the first and second memory banks 121 and 122 until the eighth point in time "T8".

The third read control signal RD2 and the third address signal ADDR2 outputted from the command/address decoder 110 at the eighth point in time "T8" may be transmitted to the first and second memory banks 121 and 122 of the memory circuit 120 as well as the address pipeline circuit 140. The third read control signal RD2 transmitted to the first and the second memory banks 121 and 122 may activate column lines in the first and second memory banks 121 and 122, which are designated by the third address signal ADDR2. The address pipeline circuit 140 may store the third address signal ADDR2 acting as the third target address signal ADDR_T2 into the address storage part 141. The index generator 142 of the address pipeline circuit 140 may count the third read control signal RD2 to generate the index of '011' and may transmit the index of '011' to the address storage part 141. The index of '011' outputted from the index generator 142 may be stored into the address storage part 141 to act as the third index INDEX2 corresponding to the third target address signal ADDR_T2.

Figure 9:
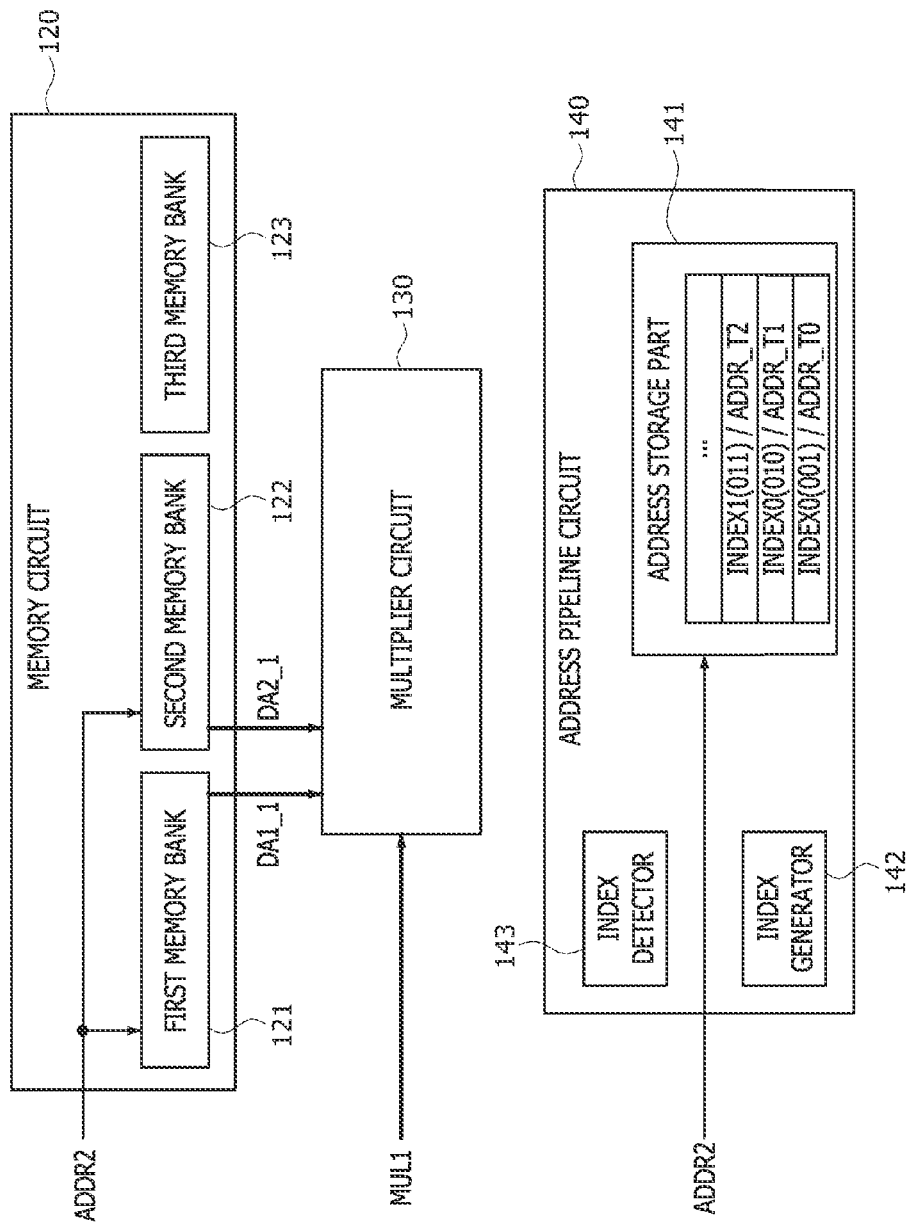

Referring to FIGS. 4 and 9, the command/address decoder 110 may generate and output a second arithmetic control signal MUL1 at a ninth point in time "T9" when a certain time elapses from the fifth point in time "T5" when the second read control signal RD1 is generated. The second arithmetic control signal MUL1 may be transmitted to the multiplier circuit 130. At the ninth point in time "T9" when the second arithmetic control signal MUL1 is outputted from the command/address decoder 110, the first input data DA1_1 and the second input data DA2_1 may start to be transmitted from the first and second memory banks 121 and 122 to the multiplier circuit 130. The first input data DA1_1 and the second input data DA2_1 may be transmitted from the first and second memory banks 121 and 122 to the multiplier circuit 130 through column lines designated by the second address signal ADDR1. The multiplier circuit 130 may perform the second EWM calculation of the first input data DA1_1 and the second input data DA2_1 in response to the second arithmetic control signal MUL1 outputted from the command/address decoder 110.

Figure 10:
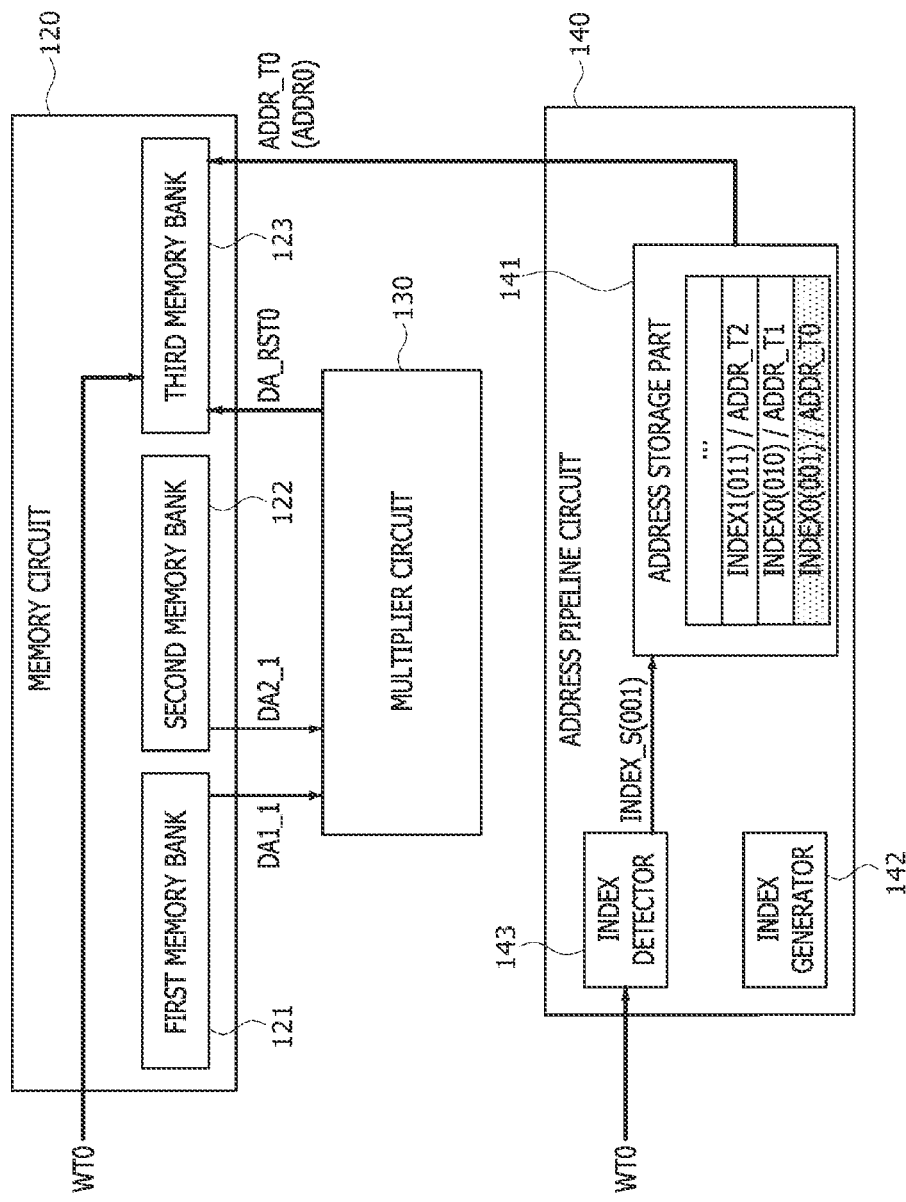

Referring to FIGS. 4 and 10, the command/address decoder 110 may generate and output the first write control signal WT0 at a tenth point in time "T10" when a certain time elapses from the sixth point in time "T6" when the first arithmetic control signal MUL0 is generated. The first write control signal WT0 may be transmitted to the third memory bank 123 and the address pipeline circuit 140. The multiplier circuit 130 may also transmit the first result data DA_RST0 (corresponding to the first result data DA_RST_0 of FIG. 2), which are generated by the first EWM calculation of the first input data DA1_0 and the second input data DA2_0, to the third memory bank 123. The index detector 143 of the address pipeline circuit 140 may count the first write control signal WT0 to generate the index selection signal INDEX_S of '001' and may transmit the index selection signal INDEX_S of '001' to the address storage part 141. The address storage part 141 may transmit the first target address signal ADDR_T0 (i.e., the first address signal ADDR0), which corresponds to the first index INDEX0 of '001' having the same value as the index selection signal INDEX_S of '001', to the third memory bank 123. The third memory bank 123 may store the first result data DA_RST0 outputted from the multiplier circuit 130 into a region of the third memory bank 123 designated by the first address signal ADDR0 outputted from the address pipeline circuit 140.

Figure 11:
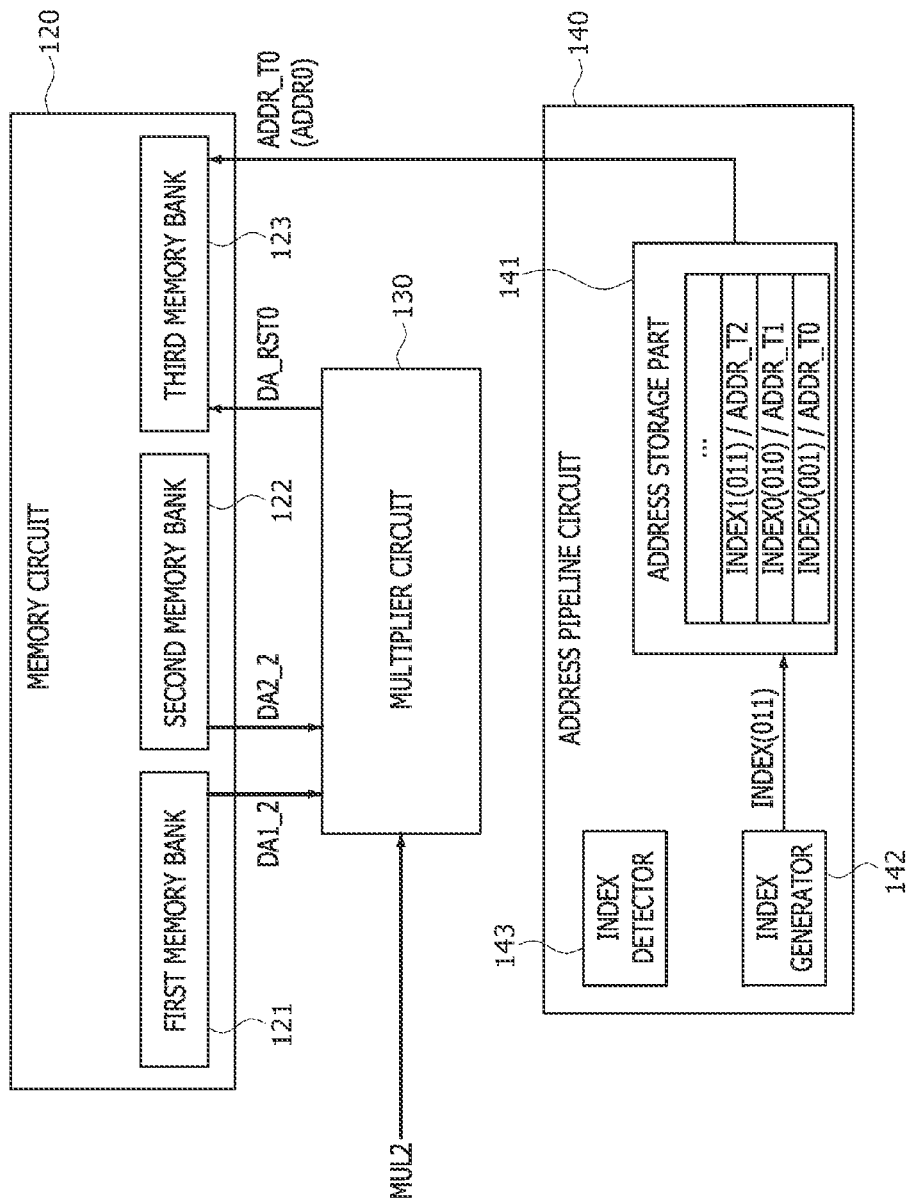

Referring to FIGS. 4 and 11, the command/address decoder 110 may generate and output a third arithmetic control signal MUL2 at an eleventh point in time "T11" when a certain time elapses from the eighth point in time "T8" when the third read control signal RD2 is generated. The third arithmetic control signal MUL2 may be transmitted to the multiplier circuit 130. At the eleventh point in time "T11" when the third arithmetic control signal MUL2 is outputted from the command/address decoder 110, the first input data DA1_2 and the second input data DA2_2 may start to be transmitted from the first and second memory banks 121 and 122 to the multiplier circuit 130. The first input data DA1_2 and the second input data DA2_2 may be stored in regions of the first and second memory banks 121 and 122 designated by the third address signal ADDR2 before the first input data DA1_2 and the second input data DA2_2 are transmitted from the first and second memory banks 121 and 122 to the multiplier circuit 130. The multiplier circuit 130 may perform the third EWM calculation of the first input data DA1_2 and the second input data DA2_2 in response to the third arithmetic control signal MUL2 outputted from the command/address decoder 110.

Figure 12:
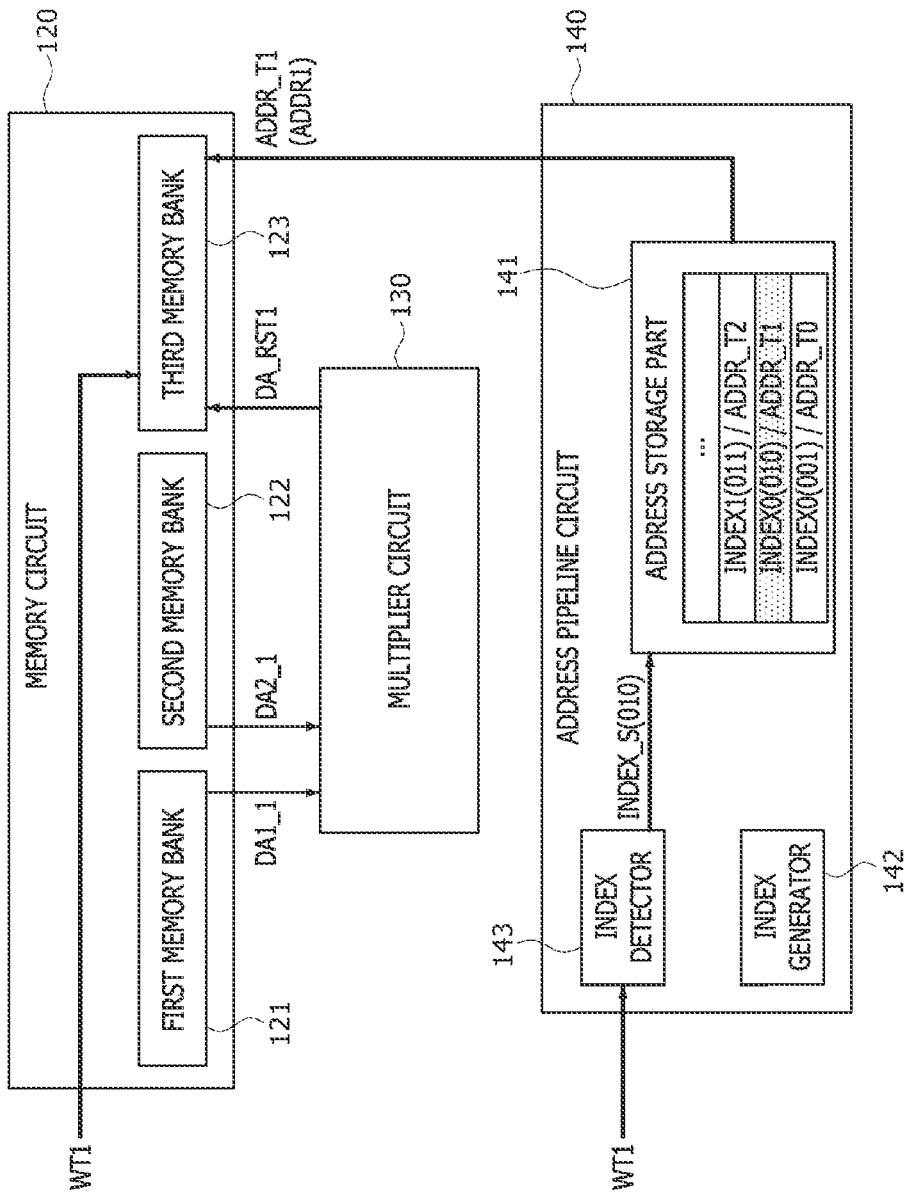

Referring to FIGS. 4 and 12, the command/address decoder 110 may generate and output the second write control signal WT1 at a twelfth point in time "T12" when a certain time elapses from the ninth point in time "T9" when the second arithmetic control signal MUL1 is generated. The second write control signal WT1 may be transmitted to the third memory bank 123 and the address pipeline circuit 140. The multiplier circuit 130 may also transmit the second result data DA_RST1 (corresponding to the second result data DA_RST_1 of FIG. 2), which are generated by the second EWM calculation of the first input data DA1_1 and the second input data DA2_1, to the third memory bank 123. The index detector 143 of the address pipeline circuit 140 may count the second write control signal WT1 to generate the index selection signal INDEX_S of '010' and may transmit the index selection signal INDEX_S of '010' to the address storage part 141. The address storage part 141 may transmit the second target address signal ADDR_T1 (i.e., the second address signal ADDR1), which corresponds to the second index INDEX1 of '010' having the same value as the index selection signal INDEX_S of '010', to the third memory bank 123. The third memory bank 123 may store the second result data DA_RST1 outputted from the multiplier circuit 130 into a region of the third memory bank 123 designated by the second address signal ADDR1 outputted from the address pipeline circuit 140.

Figure 13:
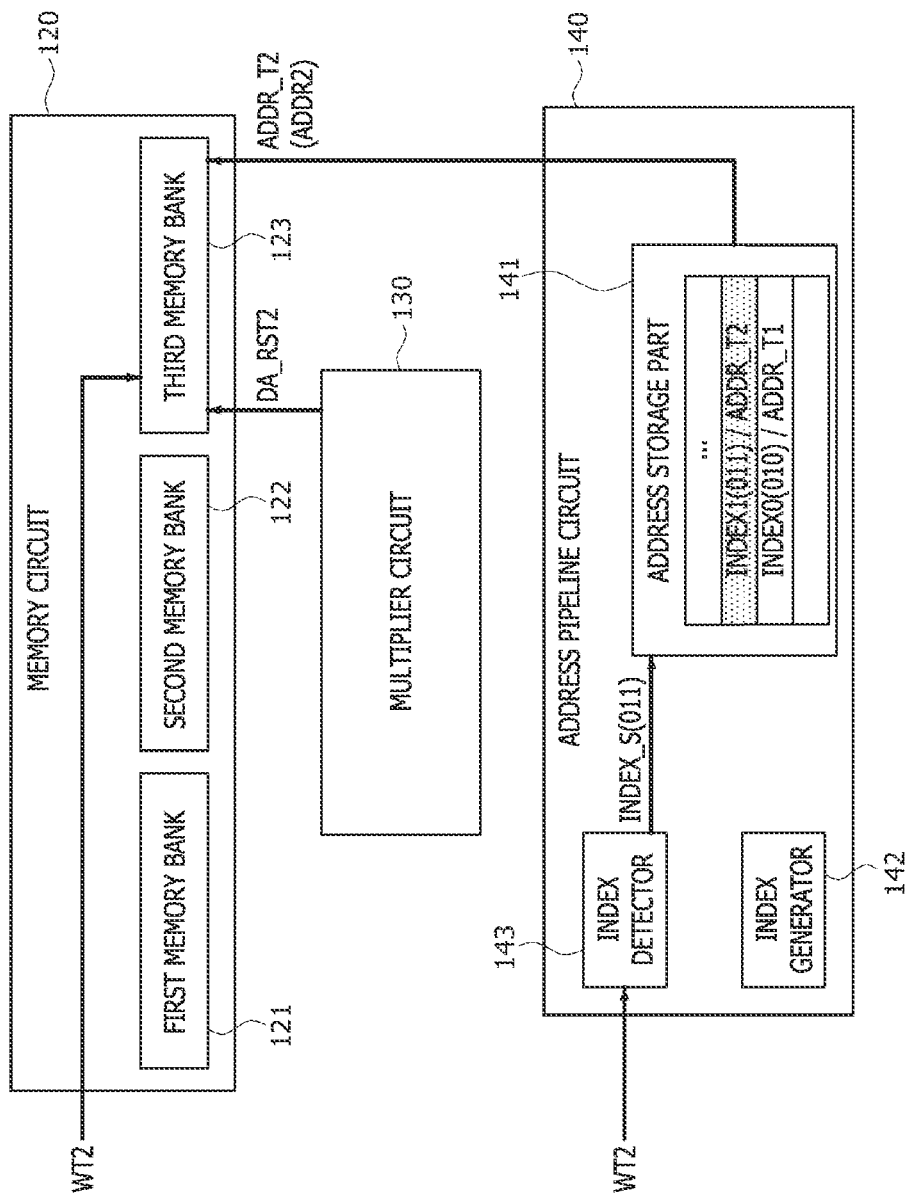

Referring to FIGS. 4 and 13, the command/address decoder 110 may generate and output the third write control signal WT2 at a thirteenth point in time "T13" when a certain time elapses from the eleventh point in time "T11" when the third arithmetic control signal MUL2 is generated. The third write control signal WT2 may be transmitted to the third memory bank 123 and the address pipeline circuit 140. The multiplier circuit 130 may also transmit the third result data DA_RST2, which are generated by the third EWM calculation of the first input data DA1_2 and the second input data DA2_2, to the third memory bank 123. The index detector 143 of the address pipeline circuit 140 may count the third write control signal WT2 to generate the index selection signal INDEX_S of '011' and may transmit the index selection signal INDEX_S of '011' to the address storage part 141. The address storage part 141 may transmit the third target address signal ADDR_T2 (i.e., the third address signal ADDR2), which corresponds to the third index INDEX2 of '011' having the same value as the index selection signal INDEX_S of '011', to the third memory bank 123. The third memory bank 123 may store the third result data DA_RST2 outputted from the multiplier circuit 130 into a region of the third memory bank 123 designated by the third address signal ADDR2 outputted from the address pipeline circuit 140.

Figure 14:
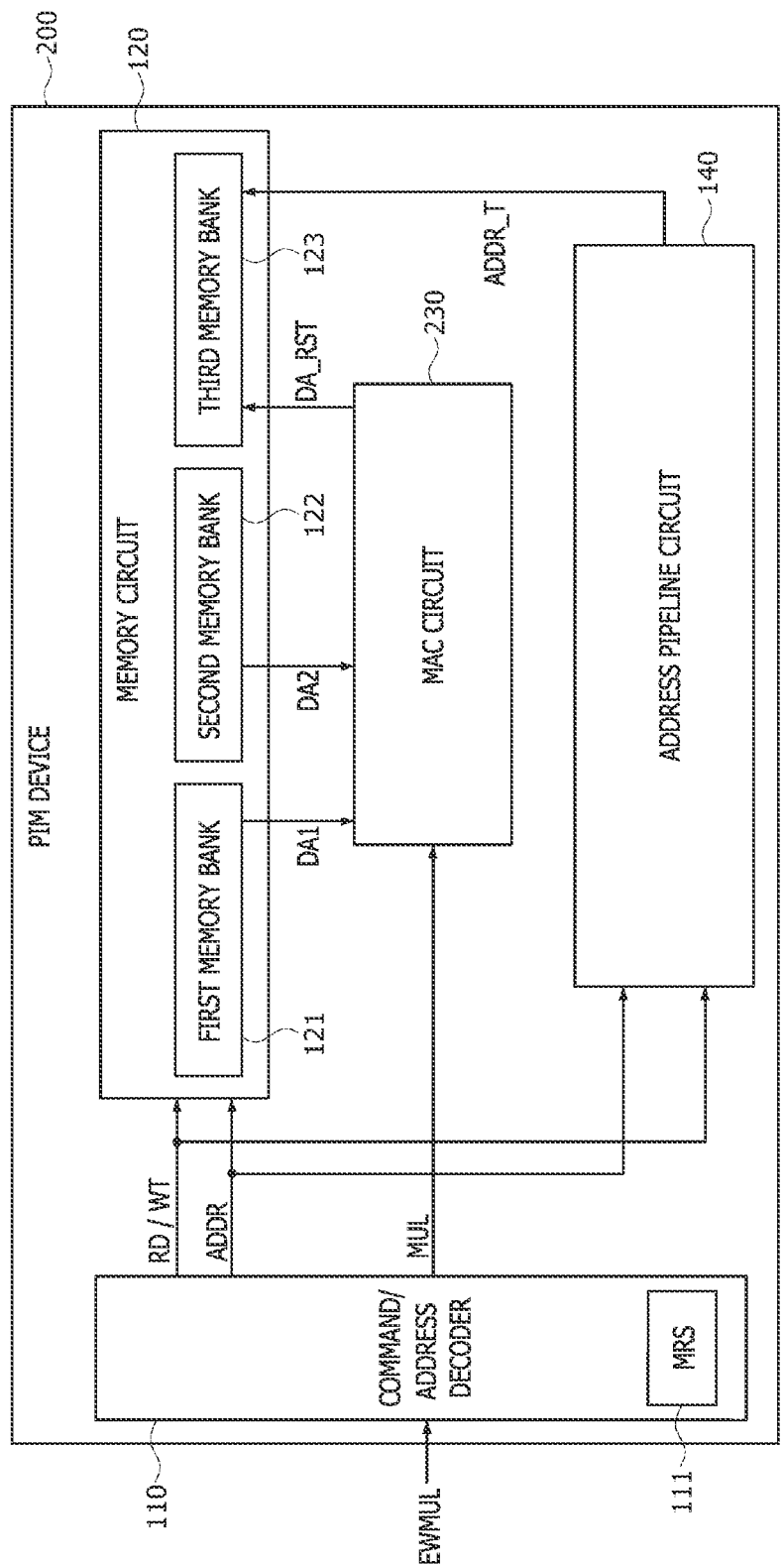
FIG. 14 is a block diagram illustrating a PIM device according to another embodiment of the present teachings.
Figure 15:
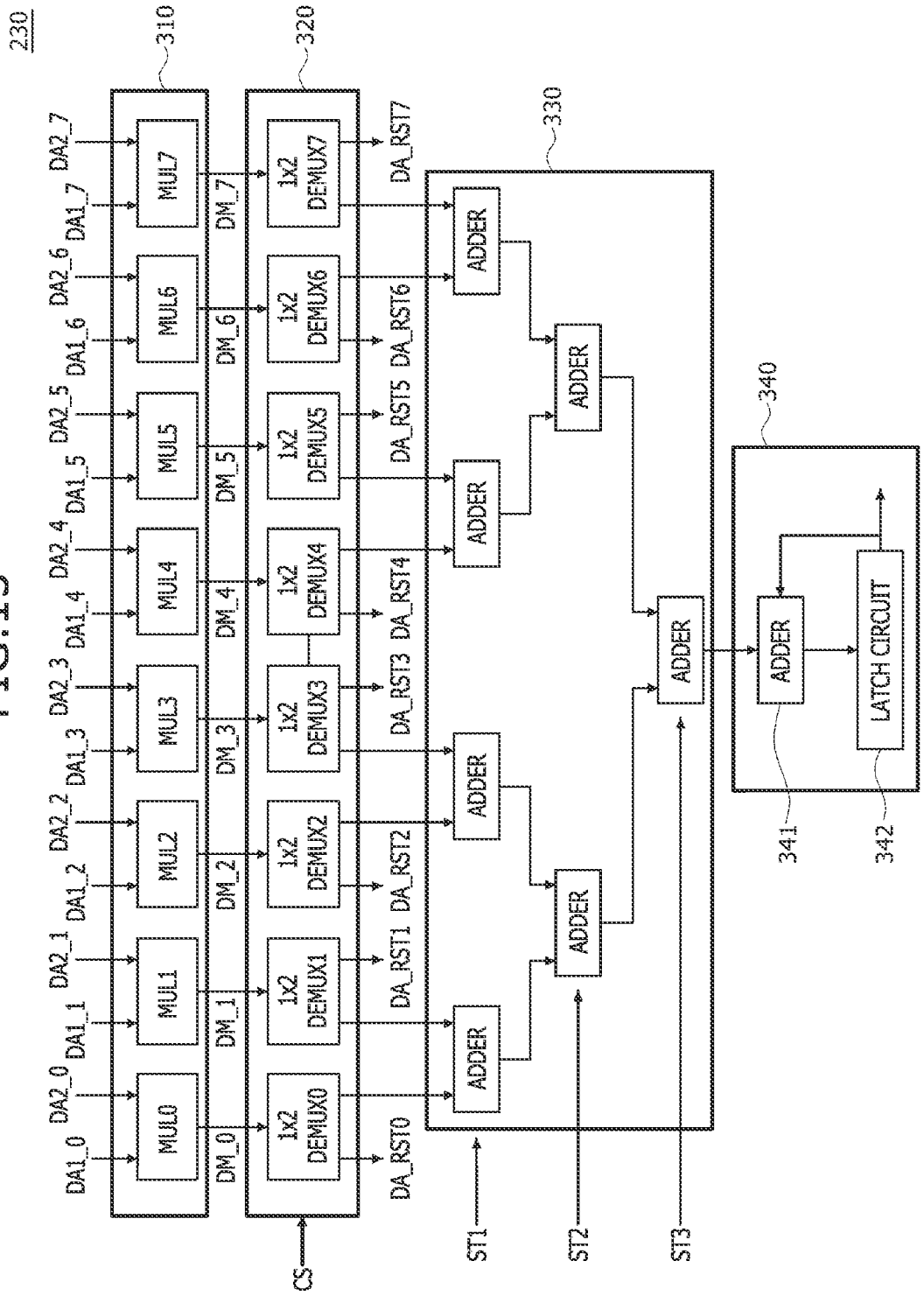
FIG. 15 is a block diagram illustrating a multiplication-and-accumulation (MAC) circuit included in the PIM device illustrated in FIG. 14.

FIG. 14 is a block diagram illustrating a PIM device 200 according to another embodiment of the present teachings, and FIG. 15 is a block diagram illustrating a multiplication-and-accumulation (MAC) circuit 230 included in the PIM device 200 illustrated in FIG. 14. In FIG. 14, the same reference numerals or the same reference symbols as used in FIG. 1 may denote the same components. Thus, detailed descriptions of the same components as described with reference to FIG. 1 will be omitted hereinafter to avoid duplicate explanation. Referring to FIGS. 1, 14, and 15, a difference between the PIM device 100 and the PIM device 200 is that the PIM device 200 includes the MAC circuit 230 while the PIM device 100 includes the multiplier circuit 130.

Specifically, as illustrated in FIG. 15, the MAC circuit 230 may include a multiplication circuit 310, a data output selection circuit 320, an adder tree 330, and an accumulation circuit 340. The multiplication circuit 310 may include a plurality of multipliers, for example, first to eighth multipliers MUL0~MUL7 which are disposed in parallel. Each of the multipliers MUL0~MUL7 may perform a multiplying calculation of the first input data DA1 and the second input data DA2 to generate and output the result data of the multiplying calculation.

The data output selection circuit 320 may output multiplication result data generated by the multiplication circuit 310 through first output lines or second output lines. In an embodiment, the data output selection circuit 320 may include a plurality of demultiplexers, for example, first to eighth demultiplexers DEMUX0~DEMUX7 which are disposed in parallel. The number of the demultiplexers constituting the data output selection circuit 320 may be equal to the number of the multipliers included in the multiplication circuit 310. Each of the demultiplexers DEMUX0~DEMUX7 may have one input terminal and two output terminals. The input terminals of the first to eighth demultiplexers DEMUX0~DEMUX7 may be coupled to output terminals of the first to eighth multipliers MUL0~MUL7, respectively. For example, the input terminal of the first demultiplexer DEMUX0 may be coupled to the output terminal of the first multiplier MUL0, and the input terminal of the second demultiplexer DEMUX1 may be coupled to the output terminal of the second multiplier MUL1. In the same way, the input terminal of the eighth demultiplexer DEMUX7 may be coupled to the output terminal of the eighth multiplier MUL7. Each of the demultiplexers DEMUX0~DEMUX7 may output the multiplication result data received from one of the multipliers MUL0~MUL7 through one of two output lines (i.e., first and second output lines), which is selected by a selection control signal CS transmitted to the data output selection circuit 320. For example, when the selection control signal CS having a logic "low" level is inputted to the data output selection circuit 320, the demultiplexers DEMUX0~DEMUX7 may output the multiplication result data, which are generated by the multiplication circuit 310, through the first output lines of the demultiplexers DEMUX0~DEMUX7. In contrast, when the selection control signal CS having a logic "high" level is inputted to the data output selection circuit 320, the demultiplexers DEMUX0~DEMUX7 may output the multiplication result data, which are generated by the multiplication circuit 310, through the second output lines of the demultiplexers DEMUX0~DEMUX7.

The adder tree 330 may include a plurality of adders which are arrayed to have a hierarchical structure, for example, a tree structure. In the present embodiment, each of the plurality of adders constituting the adder tree 330 may be realized using a half-adder. However, the present embodiment including the adder tree 330 realized using half-adders may be merely an example of the present disclosure. That is, in some other embodiment, each of the plurality of adders constituting the adder tree 330 may be realized using a full-adder. A highest stage (i.e., a first stage ST1) of the adder tree 330 may include four first adders which are disposed in parallel. A second stage ST2 located under the first stage ST1 may include two second adders which are disposed in parallel. A third stage ST3 corresponding to a lowest stage of the adder tree 330 may be located under the second stage ST2 and may include only a single adder.

A first input terminal and a second input terminal of each of the adders disposed in the first stage ST1 may be coupled to respective ones of the first output lines of two demultiplexers among the first to eighth demultiplexers DEMUX0~DEMUX7 constituting the data output selection circuit 320. Thus, each of the adders disposed in the first stage ST1 may perform an adding calculation of output data (i.e., the multiplication result data) of two of the demultiplexers included in the data output selection circuit 320 to generate and output addition result data. Moreover, each of the adders in the second stage ST2 may perform an adding calculation of output data (i.e., the addition result data) of two of the adders in the first stage ST1 to generate and output addition result data. Furthermore, the adder in the third stage ST3 may perform an adding calculation of output data (i.e., the addition result data) of the two adders in the second stage ST2 to generate and output addition result data.

The accumulation circuit 340 may include an accumulative adder 341 and a latch circuit 342. The accumulative adder 341 may perform an adding calculation for adding the addition result data outputted from the adder tree 330 to feedback data outputted from the latch circuit 342, thereby generating and outputting accumulation-added result data. The accumulation-added result data may be transmitted to the latch circuit 342. In an embodiment, the accumulative adder 341 may be realized using a half-adder. The latch circuit 342 may latch the accumulation-added result data to feedback the latched data of the accumulation-added result data to the accumulative adder 341 or to output the latched data of the accumulation-added result data to an external device coupled to the MAC circuit 230. In an embodiment, the latch circuit 342 may include a flip-flop.

According to the present embodiment, the MAC circuit 230 of the PIM device 200 may perform a MAC arithmetic operation or the EWM arithmetic operation. When the MAC circuit 230 performs the MAC arithmetic operation, output data of the demultiplexers DEMUX0~DEMUX7 constituting the data output selection circuit 320 may be transmitted to the adders constituting the first stage ST1 of the adder tree 330. Output data of the adder disposed in the third stage ST3 of the adder tree 330 may be accumulatively added to the feedback data corresponding to the output data of the latch circuit 342 included in the accumulation circuit 340.

When the MAC circuit 230 performs the EWM arithmetic operation, the output data of the demultiplexers DEMUX0~DEMUX7 constituting the data output selection circuit 320 are not transmitted to the adder tree 330 but transmitted to an external device coupled to the MAC circuit 230. In order that the MAC circuit 230 performs the EWM arithmetic operation, the first input data DA1_0~DA1_7 may be inputted to respective ones of the first input terminals of the first to eighth multipliers MUL0~MUL7 and the second input data DA2_0~DA2_7 may be inputted to respective ones of the second input terminals of the first to eighth multipliers MUL0~MUL7. As described with reference to FIG. 1, the first input data DA1_0~DA1_7 may be outputted from the first memory banks 121, and the second input data DA2_0~DA2_7 may be outputted from the second memory banks 122. When the EWM arithmetic operation is performed for a first matrix and a second matrix, the first input data DA1_0~DA1_7 may be elements of the first matrix and the second input data DA2_0~DA2_7 may be elements of the second matrix.

When the MAC circuit 230 performs the EWM arithmetic operation, the first input data and the second input data inputted to each of the first to eighth multipliers MUL0~MUL7 may be elements which are located at the same position in the first and second matrices. For example, the first input data DA1_0 inputted to the first input terminal of the first multiplier MUL0 may be an element located at a cross point of a first row and a first column of the first matrix, and the second input data DA2_0 inputted to the second input terminal of the first multiplier MUL0 may be an element located at a cross point of a first row and a first column of the second matrix. Similarly, the first input data DA1_1 inputted to the first input terminal of the second multiplier MUL1 may be an element located at a cross point of a first row and a second column of the first matrix, and the second input data DA2_1 inputted to the second input terminal of the second multiplier MUL1 may be an element located at a cross point of a first row and a second column of the second matrix. The first to eighth multipliers MUL0~MUL7 may perform multiplying calculations of the first input data DA1 and the second input data DA2 to generate and output first to eighth multiplication result data DM_0~DM_7 to the data output selection circuit 320. The demultiplexers DEMUX0~DEMUX7 constituting the data output selection circuit 320 may output the first to eighth multiplication result data DM_0~DM_7, which are generated by the first to eighth multipliers MUL0~MUL7, through the first output lines of the demultiplexers DEMUX0~DEMUX7 based on the selection control signal CS.

The PIM device 200 may perform the same operations as the PIM device 100 described with reference to FIGS. 1 to 13 except the operation of the MAC circuit 230. Specifically, when first to eighth EWM commands EWMUL0~EWMUL7 are sequentially inputted to the PIM device 200, the first input data DA1_0~DA1_7 and the second input data DA2_0~DA2_7 may be sequentially transmitted from the first memory bank 121 and the second memory bank 122 to the MAC circuit 230 by read control signals RD and first to eighth address signals ADDR0~ADDR7. In such a case, the first to eighth address signals ADDR0~ADDR7 may be sequentially stored into the address pipeline circuit 140 to act as first to eighth target address signals ADDR_T0~ADDR_T7 which are matched with first to eighth indexes INDEX0~INDEX7. The MAC circuit 230 may perform the EWM calculations of the first input data DA1_0~DA1_7 and the second input data DA2_0~DA2_7 in response to first to eighth arithmetic control signals MUL0~MUL7, thereby generating and outputting first to eighth result data DA_RST0~DA_RST7. The first to eighth result data DA_RST0~DA_RST7 may be transmitted to the third memory banks 123. The third memory banks 123 may store the first to eighth result data DA_RST0~DA_RST7 into regions designated by the first to eighth target address signals ADDR_T0~ADDR_T7, which are outputted from the address pipeline circuit 140, in response to write control signals WT.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
    a multiplication-and-accumulation (MAC) circuit configured to perform a MAC arithmetic operation or an element-wise multiplication (EWM) calculation for first input data and second input data to generate result data;
    a memory circuit comprising:
        a first memory bank storing the first input data;
        a second memory bank storing the second input data; and
        a third memory bank into which the result data are stored,
            wherein a region of the first memory bank in which the first input data are stored, a region of the second memory bank in which the second input data are stored, and a region of the third memory bank in which the result data are stored have the same row address, and
            wherein the memory circuit is configured to output the first input data and the second input data to the MAC circuit in response to a read control signal and configured to store the result data in response to a write control signal; and
    an address pipeline circuit configured to receive the read control signal to store an address signal used as a target address signal for designating a region of the memory circuit into which the result data are stored and configured to receive the write control signal to output the target address signal to the memory circuit.

2. The PIM device of claim 1, wherein the MAC circuit comprises:
    a multiplication circuit including a plurality of multipliers which are disposed in parallel;
    a data output selection circuit configured to output multiplication result data corresponding to output data of the multiplication circuit through first output lines or second output lines;
    an adder tree including a plurality of adders which are disposed to have a tree structure and coupled to the first output lines or the second output lines; and
    an accumulation circuit configured to perform an accumulative adding calculation for output data of the adder tree.

3. The PIM device of claim 2,
    wherein the data output selection circuit includes a plurality of demultiplexers configured to receive the multiplication result data from respective multipliers of the plurality of multipliers and output the multiplication result data through the first output lines or the second output lines.

4. The PIM device of claim 3,
    wherein the first output lines of the plurality of demultiplexers are coupled to an external device disposed outside the MAC circuit, and the second output lines of the plurality of demultiplexers are coupled to the adder tree.

5. The PIM device of claim 4,
wherein the plurality of demultiplexers is configured to output the multiplication result data, which are received from respective multipliers of the plurality of multipliers, through the second output lines when the MAC arithmetic operation is performed and is configured to output the multiplication result data, which are received from respective ones of the plurality of multipliers, through the first output lines when the EWM calculation is performed.

6. The PIM device of claim 1, further comprising a command/address decoder configured to generate control signals and the address signal in response to an EWM command.

7. The PIM device of claim 6, wherein:
the read control signal, an arithmetic control signal, and the write control signal are included in the control signals; and
the command/address decoder is configured to sequentially output the read control signal, the arithmetic control signal, and the write control signal.

8. The PIM device of claim 7,
wherein the command/address decoder is configured to:
transmit both the read control signal and the write control signal to each of the memory circuit and the address pipeline circuit; and
transmit the arithmetic control signal to the MAC circuit.

9. The PIM device of claim 8,
wherein the command/address decoder is configured to transmit all of the read control signal, the write control signal, and the address signal to each of the memory circuit and the address pipeline circuit.

10. The PIM device of claim 1,
wherein the region of the first memory bank in which the first input data are stored, the region of the second memory bank in which the second input data are stored, and the region of the third memory bank in which the result data are stored have the same column address.

11. The PIM device of claim 1, further comprising a command/address decoder configured to sequentially generate the read control signal, the address signal, an arithmetic control signal, and the write control signal in response to an EWM command,
wherein the first memory bank and the second memory bank are configured to output the first input data and the second input data, which are stored in regions of the first and the second memory banks designated by the address signal, to the MAC circuit in response to the read control signal; and
wherein the third memory bank is configured to store the result data into a region of the third memory bank, which is designated by the target address signal outputted from the address pipeline circuit, in response to the write control signal.

12. The PIM device of claim 1, wherein the address pipeline circuit includes:
a plurality of address storage regions, each of which is configured to store the target address signal;
a plurality of index storage regions, each of which is configured to store an index corresponding to the target address signal;
an index generator configured to generate the index in response to the read control signal; and
an index detector configured to generate an index selection signal in response to the write control signal.

13. The PIM device of claim 12,
wherein the index generator is configured to count the read control signal to generate the index having the counted value of the read control signal; and
wherein the index detector is configured to count the write control signal to generate the index selection signal having the counted value of the write control signal.

14. The PIM device of claim 13,
wherein the address pipeline circuit is configured to output one of the target address signals stored in the plurality of address storage regions, which is matched with the index having the same value as the index selection signal, to the memory circuit.

* * * * *